(12) United States Patent
Baycura (10) Patent No.: US 7,845,956 B1
(45) Date of Patent: Dec. 7, 2010

(54) ELECTRICAL COMPONENT INTERFACE

(76) Inventor: Thomas Baycura, 181 Shelley Ave., Campbell, CA (US) 95008

( * ) Notice: Subject to any disclaimer, the term of this patent is extended or adjusted under 35 U.S.C. 154(b) by 0 days.

(21) Appl. No.: 12/454,908

(22) Filed: May 26, 2009

(51) Int. Cl.
  *H01R 12/00* (2006.01)
(52) U.S. Cl. .................................. 439/71; 361/707
(58) Field of Classification Search .............. 439/70, 439/71; 361/707
  See application file for complete search history.

(56) References Cited

U.S. PATENT DOCUMENTS

| | | | |
|---|---|---|---|
| 4,099,816 A | | 7/1978 | Bittner et al. |
| 4,524,240 A | | 6/1985 | Stock et al. |
| 4,772,864 A | | 9/1988 | Otto et al. |
| 4,871,317 A | | 10/1989 | Jones |
| 4,894,015 A | * | 1/1990 | Stockero et al. ............... 439/67 |
| 5,162,729 A | * | 11/1992 | Lusby ........................ 324/766 |
| 5,278,724 A | * | 1/1994 | Angulas et al. ............. 361/707 |
| 5,572,409 A | | 11/1996 | Nathan et al. |
| 5,605,477 A | * | 2/1997 | Wu et al. ................ 439/620.24 |
| 5,856,636 A | | 1/1999 | Sanso |
| 6,028,770 A | * | 2/2000 | Kerner et al. ................ 361/704 |
| 6,061,243 A | * | 5/2000 | Barnett et al. ................ 361/704 |
| 6,265,952 B1 | | 7/2001 | Kan |
| 6,467,163 B1 | | 10/2002 | Laschinski |
| 7,310,236 B2 | * | 12/2007 | Takahashi et al. ........... 361/757 |
| 7,378,600 B2 | | 5/2008 | Chan et al. |
| 7,393,226 B2 | * | 7/2008 | Clayton et al. .............. 439/196 |

* cited by examiner

*Primary Examiner*—Truc T Nguyen
(74) *Attorney, Agent, or Firm*—Brian R. Short (57) ABSTRACT

An apparatus and method of providing an electrical component interface is disclosed. For one embodiment, the electrical component interface includes an electrical component adapter. The electrical component adapter includes an electronic component solder pattern for receiving and allowing attachment of an electrical component. An adhesive backing is adjacent a surface of the electrical component adapter. The adhesive backing provides attachment of the electrical component adapter to a second surface.

15 Claims, 10 Drawing Sheets

SOLDERING THE ELECTRICAL COMPONENT TO ELECTRICAL CONTACTS OF AN ELECTRICAL COMPONENT ADAPTER.

410

APPLYING AN ADHESIVE TO A SURFACE OF THE ELECTRICAL COMPONENT ADAPTER.

420

ATTACHING THE ELECTRICAL COMPONENT ADAPTER TO THE PRINTED CIRCUIT BOARD.

ATTACHING A FIRST FLEXIBLE CIRCUIT BOARD TO THE PRINTED CIRCUIT BOARD, WHEREIN THE ATTACHMENT IS PROVIDED BY AN ADHESIVE PREVIOUSLY DEPOSITED ON THE FIRST FLEXIBLE CIRCUIT BOARD.

610

ATTACHING AN ELECTRICAL COMPONENT ADAPTER TO THE FIRST FLEXIBLE CRICUIT BOARD, WHEREIN THE ATTACHMENT IS PROVIDED BY AN ADHESIVE PREVIOUSLY DEPOSITED ON THE ELECTRCIAL ADAPTER.

620

SOLDERING THE ELECTRICAL COMPONENT TO THE CONTACTS OF THE ELECTRICAL COMPONENT ADATER.

```
┌─────────────────────────────────────────────┐
│  AFFIXING A FLEXIBLE INSULATING LAYER OVER AT│
│  LEAST A PORTION OF THE PRINTED CIRCUIT BOARD,│
│       WHEREIN THE FLEXIBLE INSULATING LAYER  │
│     COMPRISES AN ADHESIVE LAYER THAT CAUSES  │
│      THE FLEXIBLE INSULATING LAYER TO ATTACH TO│
│       THE PORTION OF THE PRINTED CIRCUIT BOARD.│
│                                             │
│                     810                     │
└─────────────────────────────────────────────┘
                      │
                      ▼
┌─────────────────────────────────────────────┐
│    AFFIXING A FLEXIBLE CIRCUIT BOARD OVER AT │
│     LEAST A PORTION OF THE FLEXIBLE INSULATING│
│    LAYER, WHEREIN AN ADHESIVE ATTACHES THE   │
│    FLEXIBLE CIRCUIT BOARD TO THE FLEXIBLE    │
│              INSULATING LAYER.               │
│                                             │
│                     820                     │
└─────────────────────────────────────────────┘
                      │
                      ▼
┌─────────────────────────────────────────────┐
│    ATTACHING AN ELECTRICAL COMPONENT TO THE  │
│   FLEXIBLE CIRCUIT BOARD, WHEREIN THE FLEXIBLE│
│     CIRCUIT BOARD FACILITATES ELECTRICAL     │
│    CONNECTIONS BETWEEN THE ELECTRICAL        │
│     COMPONENT AND THE PRINTED CIRCUIT BOARD. │
│                                             │
│                     830                     │
└─────────────────────────────────────────────┘
```

FIG. 8

INSERTING ELONGATED ALIGNMENT GUIDES THROUGH ALIGNMENT HOLES OF THE FLEXIBLE CIRCUIT BOARD AND HOLE PATTERN OF THE HOLE MATRIX PROTO-BOARD.

910

URGING THE FLEXIBLE CIRCUIT BOARD AGAINST THE HOLE MATRIX PROTO-BOARD UNTIL THE ADHESIVE OF THE FLEXIBLE CIRCUIT BOARD AFFIXES THE FLEXIBLE CIRCUIT BOARD TO THE HOLE MATRIX PROTO-BOARD.

ELECTRICAL COMPONENT INTERFACE

FIELD OF THE EMBODIMENTS

The described embodiments relate generally to electronic circuits. More particularly, the described embodiments relate to an electrical component interface.

BACKGROUND

Three design phases occur typically before a new electronic circuit design is released for high-volume manufacture. The first phase is the design of the circuit, which is typically performed using computer-aided design (CAD). CAD is computer software that models the circuit generating its theoretical performance.

The second phase is testing the CAD model with a prototype circuit. A prototype circuit is a hand-wired assembly with physical electronic components. The advantages of building and testing a prototype circuit are multifold. The first is it validates the final selection of the electronic components. Often a component's cost, lead-time, or pending obsolesce, forces the designer to substitute the theoretical CAD values with the closest parts commercially available. A prototype circuit ensures these alternate components do not adversely affect the final circuit performance. Secondly, it tests design parameters historically difficult to model in CAD, such as grounding issues, electrical noise, or thermal effects. Finally, and often most importantly, a prototype circuit interfaces and operates real-world devices: a feature impossible with CAD software.

The final (third) design phase is a low-volume fabrication of the circuit in final production form. Typically this includes mounting all the components onto a custom designed printed circuit board (PCB); this phase is commonly referred to in the industry as a 'first article' PCB. The first article PCB is then extensively tested before the design is approved to high-volume production.

Although these three phases have been followed for decades, problems still exist within this design paradigm. While advances in CAD software have dramatically reduced the initial circuit design phase, unfortunately, no similar advances have paralleled for circuit prototyping technology. Using current prototyping technology, the time required to assemble even a relatively simple circuit, i.e. with only a dozen electronic components, can take days of intense labor. Larger designs, with 50 or more components, may require weeks.

Circuit designers with impacted schedules are often forced to skip the prototyping phase altogether; proceeding directly from the CAD model to a first article PCB. This path appears, at least initially, to shorten the design cycle, but entails a significant amount of risk. The reason is the cost to produce a first article PCB is significant, in both time and money, and investing this on a design only theoretically modeled in CAD can result in a PCB with a multitude of design errors. This issue is further complicated due to the fact that design errors on the finished PCB are now extremely difficult, or impossible, to correct. The problem is every electrical component soldered to a PCB requires a matching solder pattern, or 'footprint', as known in the industry. If a PCB design error requires a new component, employing an alternate footprint, it can't be soldered to the PCB. Even if the footprints match, the new component's pin-for-pin functionality, also known as its 'pin compatibility', may differ resulting in circuit incompatibility. If either of these conditions exists, the PCB cannot be easily modified, and often must be scrapped and redesigned again incurring further cost and project delays.

The circuit designer today, therefore, must choose between the time and labor to prototype a circuit to validate its performance vs. the cost of producing, often a series, of un-modifiable PCBs. It would be a significant advantage to the circuit designer to have a method available that facilitates both rapid circuit prototyping plus has the additional ability to easily modify PCB solder footprints to correct design errors.

Many types of circuit prototyping methods and technologies currently exist, but all have limitations or inherent drawbacks to their designs. In addition, none of these existing prototype methods have useful applications to easily modify a PCB's component's solder footprints.

The prototype method selected by the designer depends primarily upon the size of the circuit, i.e. the number of electronic components, and their technology. Two primary component types exist today; through-hole and surface mount technology (SMT). As their names imply, through-hole electrical components are soldered into hole patterns on a PCB while SMT devices are soldered only to the surface.

One of the earliest types of through-hole prototyping technologies employ electrically conductive sockets into which the through-hole component's leads are inserted without solder. Several problems, however, exist with all socket prototype methods. The first is the prototype circuits developed inherently lack a continuous, power or ground plane, so the circuit's power and clock speeds are limited. Second, socket connection methods have a long history in the industry for generating intermittent electrical connections, especially after age and repeated use. Due to these limitations, socket prototype methods are normally only employed by hobbyist or used in classroom experimentation. Attempting to use these socket prototype technologies to modify a PCB's solder footprints is virtually impossible.

An alternate prototype method employs a PCB fabricated with a variety of solder footprints onto which the designer solders the electronic components and wires. This method is known in the industry as a proto-PCB and may be used for through-hole or SMT devices. Proto-PCB methods have several advantages over socket prototype methods, since soldering the components and wires directly to the proto-PCB significantly improve the electrical connections and mechanical robustness. Also, the internal power and ground planes provided within the proto-PCB enable higher power and faster circuit clock speeds.

The inherent limitation, however, with any proto-PCB method is the finite number of solder footprints available, limiting the component types and circuit size. In addition, repeated soldering and de-soldering components, typically performed in a prototype development phase, can result in permanent damage the proto-PCB's solder footprints. If a critical number of these solder footprints were damaged, the entire circuit must be scrapped and reassembled again on a new proto-PCB. Like other single, monolithic assemblies previously described, proto-PCB boards are too large to be effectively mounted to a PCB, and as such can not be used as a method to modify individual solder footprints on a PCB.

In the 1990's, the electronics industry began phasing out through-hole devices in favor of SMT components, and today SMT devices are employed almost exclusively in all new PCB designs. SMT components are soldered only to the surface of a PCB and, therefore, can be designed much smaller than their through-hole counterparts. A typical SMT integrated component (IC), can have a body size less than 12 mm long with electrical leads less than 0.5 mm long. Prototyping a circuit by hand soldering wires directly to a 0.5 mm SMT component lead is virtually impossible, even under a microscope. For this reason, all SMT prototype methods require the SMT component to be first soldered to a small interface PCB, or 'component adapter' as commonly known in the industry. Each component adapter typically has a single solder footprint and employ traces connecting the component's leads to larger solder patterns. The larger solder patterns enable the user to hand-solder wires relatively easily. Component adapters have advantages over monolithic proto-board methods, since an unlimited number of component adapters can be incorporated generating prototype circuits of any size, and individual adapters may be added or replaced if damaged without affecting the entire circuit.

One drawback, however, with all component adapter methods is their small size: a design requirement necessary to reduce the overall size of the prototype circuit. A typical component adapter is not much larger than its single solder footprint and often less than 25 mm×25 mm in size. Soldering components and wires to a multitude of these small component adapters are often so difficult any attempt at a logical design layout is usually abandoned. In the end most prototype component adapter circuits resemble, and are commonly referred to in the industry, as a 'rats nest' of wires. Once assembled, modifications to such a circuit are definitely not for the faint hearted. A second limitation is the prototype circuits formed by these individual adapters lack any type of continuous power or ground plane thus the circuit's clock speeds and performance are limited. Finally, nothing is provided in any of these methods to fixture the individual component adapters either to a surface, or each other. The final assembly is very mechanically fragile and often can't be transported, restricting them to static applications such as an engineering bench.

With simply nothing else available to the designer today, these component adapters are often forced into service as a method to correct PCB design errors, but with limited results. One problem is the adapters are designed from rigid materials, so it's time-consuming to cut and shape them to fit the irregular spaces of a PCB. Secondly, due to the risk of electrical shorts, the component adapters normally can't be placed on, or near, exposed PCB traces. The result is adapters being mounted relatively far from their intended location requiring lengthy, exposed wiring reducing circuit performance and increasing electrical noise. Lastly, none of the component adapters available today provide a method to fixture the component adapters either to a surface, or each other, so it's left to the designer to glue, tape, or screw etc. the adapters to the PCB. This extra step adds further time to an already time-consuming process and, depending on the method, can result in permanent damage to the PCB.

An alternate type of component adapter as suggested by U.S. Pat. No. 6,265,952 (Kan, 2001) includes a method in which the component adapters are designed with permanent leads matching hole patterns of a passive hole matrix proto-board. This feature allows the component adapters to be mounted securely to the holes of the proto-board improving mechanical strength and organization. The adapter's leads also provide an easy connection point for the prototype circuit's wires for hand soldering or wire wrapping. The design trade-off, however, for having permanent leads is it limits the adapters to single-use applications, since a hole matrix proto-board, or similar, is required to mount the adapter. As such, this component adapter design cannot develop circuits with continuous power or ground planes, which again limits the clock speeds and performance of the prototype circuit. The second drawback is the fixed leads prevent the adapters for use as a method to modify PCB footprints. All through-hole type adapters require matching hole patterns, so these device can't modify a PCB component's solder footprint or its pin compatibility.

A similar type of hole matrix proto-board mounted component adapter is suggested by U.S. Pat. No. 4,871,317 (Jones, 1989). In this adaptation, the component adapters are formed using flexible vs. rigid PCB technology and attachable leads vs. the permanent leads as described in U.S. Pat. No. 6,265,952 (Kan, 2001). The major drawback to this design, however, is the designer must solder a separate wire-wrap pin array to each component adapter in order mount the component adapters to a hole matrix proto-board. Although this concept would work, it significantly increases the assembly time compared to other prototype methods currently available. Even with the pin adapters soldered, the prototype circuit developed is still a wire-wrapped assembly. Wire wrap prototype circuits are prone to intermittent electrical connections and inherently lack continuous power or ground planes limiting the circuit's power and clock speeds.

Other embodiments of the component adapters suggested by U.S. Pat. No. 4,871,317 (Jones, 1989) do not include wire-wrap pins soldered to the adapters. However, this configuration is even further problematic. Without the wire-wrap pin arrays, the component adapters can't be aligned to the proto-board holes, therefore, the designer needs to hand-align the component adapters to the proto-board holes, while simultaneously attempting to solder the interconnecting wires: a time consuming and difficult process. Furthermore, nothing is provided in this mode to fixture the component adapters, either to the proto-board or each other. As a result, prototype circuits developed in this adaptation are more mechanically fragile than rigid component adapters due to the thin flexible materials employed. In this scenario it can be seen the function and inherent drawbacks are now identical, or in some cases worse, to other component adapters described above.

In summary, therefore, all previous electronic circuit prototype methods have the following disadvantages or design trade-offs:
  (a) Are time consuming and difficult to assemble.
  (b) Result in prototype circuits that are mechanically fragile.
  (c) Result in prototype circuits that are unorganized.
  (d) Limit the prototype circuit in size or component types.
  (e) Require component adapters with external pins or other mounting hardware.
  (f) Employ component adapters restricted to hole-matrix or proto-board applications.
  (g) Develop prototype circuits that are difficult to modify or repair.
  (h) Cannot develop prototype circuits with power or ground planes.
  (i) Develop prototype circuits with intermittent electrical connections.
  (j) Are all restricted to single-use applications and are an ineffective method to modify the solder footprints of a PCB circuit.

It is desirable to have a method, system and apparatus for addressing the above-listed problems of electronic circuit prototyping.

SUMMARY

One embodiment includes an electrical component interface. The electrical component interface includes an electrical component adapter. The electrical component adapter includes an electronic component solder pattern for receiving and allowing attachment of an electrical component. An adhesive backing is adjacent a surface of the electrical component adapter. The adhesive backing provides attachment of the electrical component adapter to a second surface.

Another embodiment includes a method of electrically connecting an electrical component to a printed circuit board. The method includes (not necessarily in the following order) soldering the electrical component to electrical contacts of an electrical component adapter, applying an adhesive to a surface of the electrical component adapter, and attaching the electrical component adapter to the printed circuit board, wherein the adhesive of the electrical component adapter affixes the electrical component adapter to the printed circuit board after attachment.

Other aspects and advantages of the described embodiments will become apparent from the following detailed description, taken in conjunction with the accompanying drawings, illustrating by way of example the principles of the described embodiments.

DETAILED DESCRIPTION

As shown in the drawings, the described embodiments are embodied in an apparatus and method for providing an electronic component interface. Some of the described embodiments provide a multi-use electronic component adapter formed from thin flexible materials with a self-adhesive backing. The unique self-adhesive mounting feature allows the user to rapidly form prototype electronic circuits on any type of surface either aligned to a traditional hole-matrix proto-board or a conductive surface. As a multi-use device, the self-adhesive adapters also allow a method to modify modification or repair of PCB solder footprints.

Figure 1:
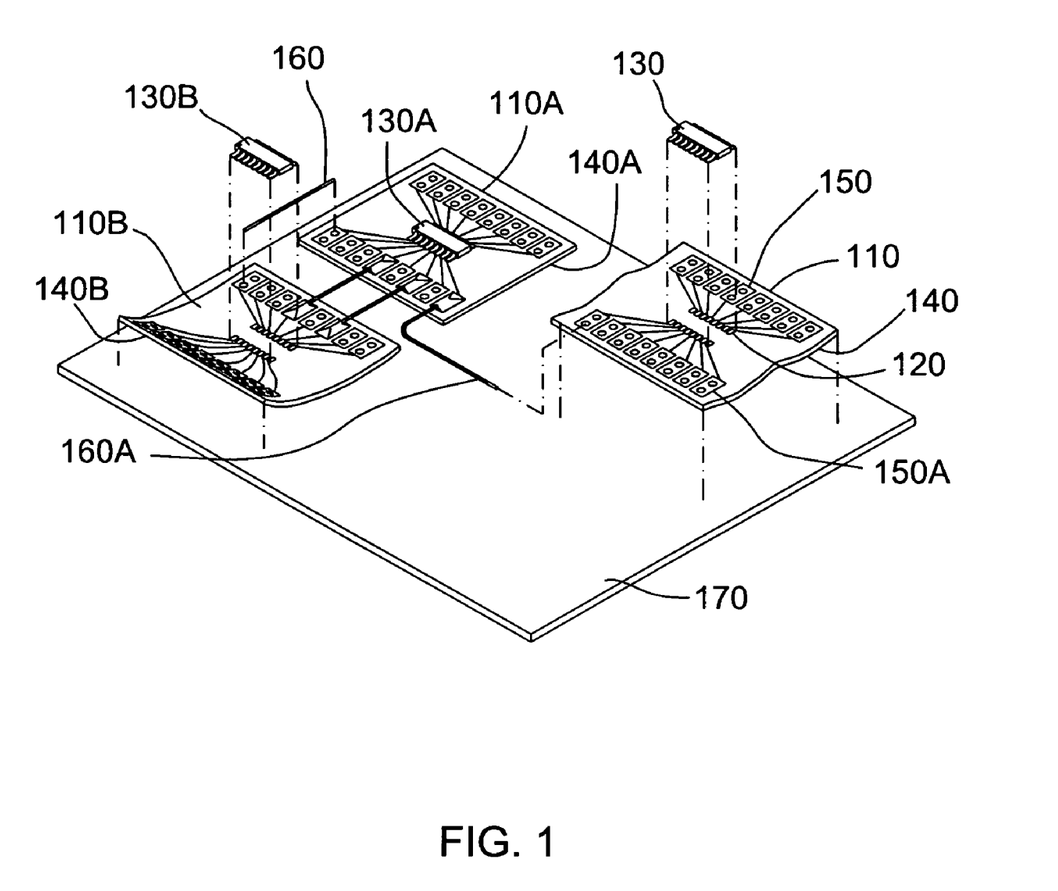
FIG. 1 shows embodiments of electrical component interfaces forming a prototype circuit on a surface.

FIG. 1 shows embodiments of electrical component interfaces 110, 110a, 110b. The electrical component interfaces 110, 110a, 110b provide electrically conductive interfaces between electrical components 130, 130a, 130b and a surface 170.

Each of the electrical component interfaces 110, 110a, 110b have adhesive backings 140, 140a, 140b that attach the electrical component interfaces 110, 110a, 110b-to the surface 170. As shown (for example, electrical component interface 110b), an embodiment of the electrical component interface is flexible (more specifically, a flexible circuit board). The flexible electrical component interface 110b in combination with the adhesive backing 140b provide for easy attachment of the electrical component interface 110b to the surface 170. Therefore, when an electrical component 130b is attached to the flexible electrical component interface 110b, the electrical component 130b can easily and reliably be electrically connected and mechanically secured to the surface 170 through the flexible electrical component interface 110b.

Embodiments of the electrical component interface 110, 110a, 110b include an electrical component solder pattern (such as, solder pattern 120). The solder pattern 120 can be formed to receive a surface mount device. Alternatively or additionally, the solder pattern 120 can be formed to receive through-hole devices (such as, through-hole device 130c shown in FIG. 2).

Embodiments of the electrical component interface 110, 110a, 110b include electrical contacts 150, 150a. The electrical contacts 150, 150a can be on a surface of the component interface 110, 110a, 110b, or formed as conductive through-holes. The electrical contacts 150, 150a can provide a point of electrical contact to the surface 170, or for example, circuit interconnect wires 160, 160a can be connected between electrical contacts 150, 150a of different electrical component interfaces 110, 110a, 110b.

As will be described, the surface 170 can be a printed circuit board. Alternatively, the surface 170 can be a conductive layer, an insulating layer, or a combination thereof.

Figure 2:
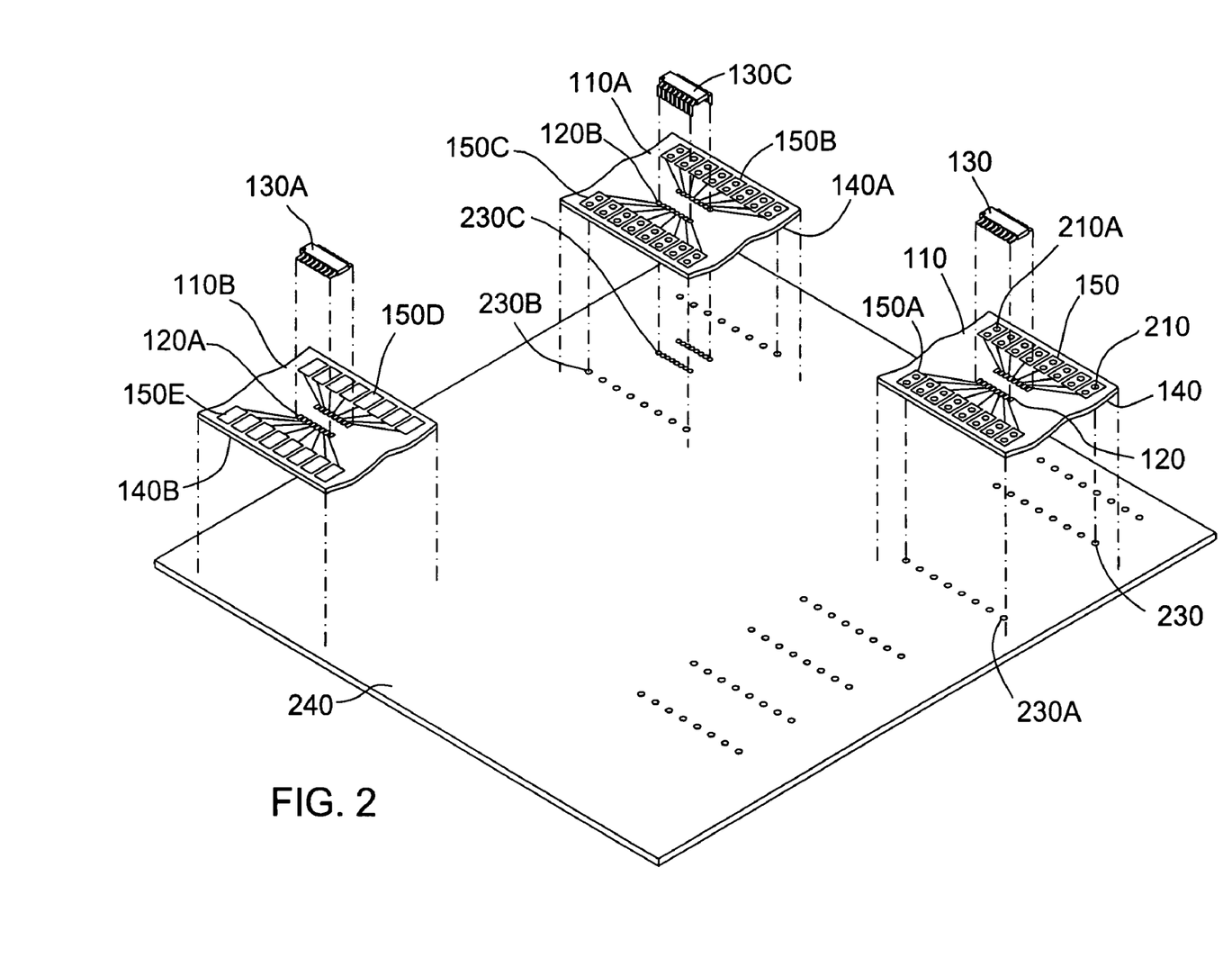
FIG. 2 shows additional embodiments of the electrical component interfaces being used to attach electrical components to a printed circuit board.

FIG. 2 shows additional embodiments of the electrical component interface. As shown, the electrical component interfaces 110, 110a, 110b can be configured so that electrical contacts 150, 150a, 150b, 150c, 150d, 150e of the electrical component interfaces 110, 110a, 110b are aligned with, for example, hole patterns 230, 230a, 230b, 230c of a printed circuit board 240. As shown, the electrical contacts of the component interfaces can include surface mount electrical contacts (such as 120a, 150d, 150e), or the electrical contacts can include through-hole electrical contacts (such as, 120b, 150b, 150c). Another embodiment can include alignment of, for example, the solder pattern 120b with at least a portion of the hole pattern 230c.

Figure 3:
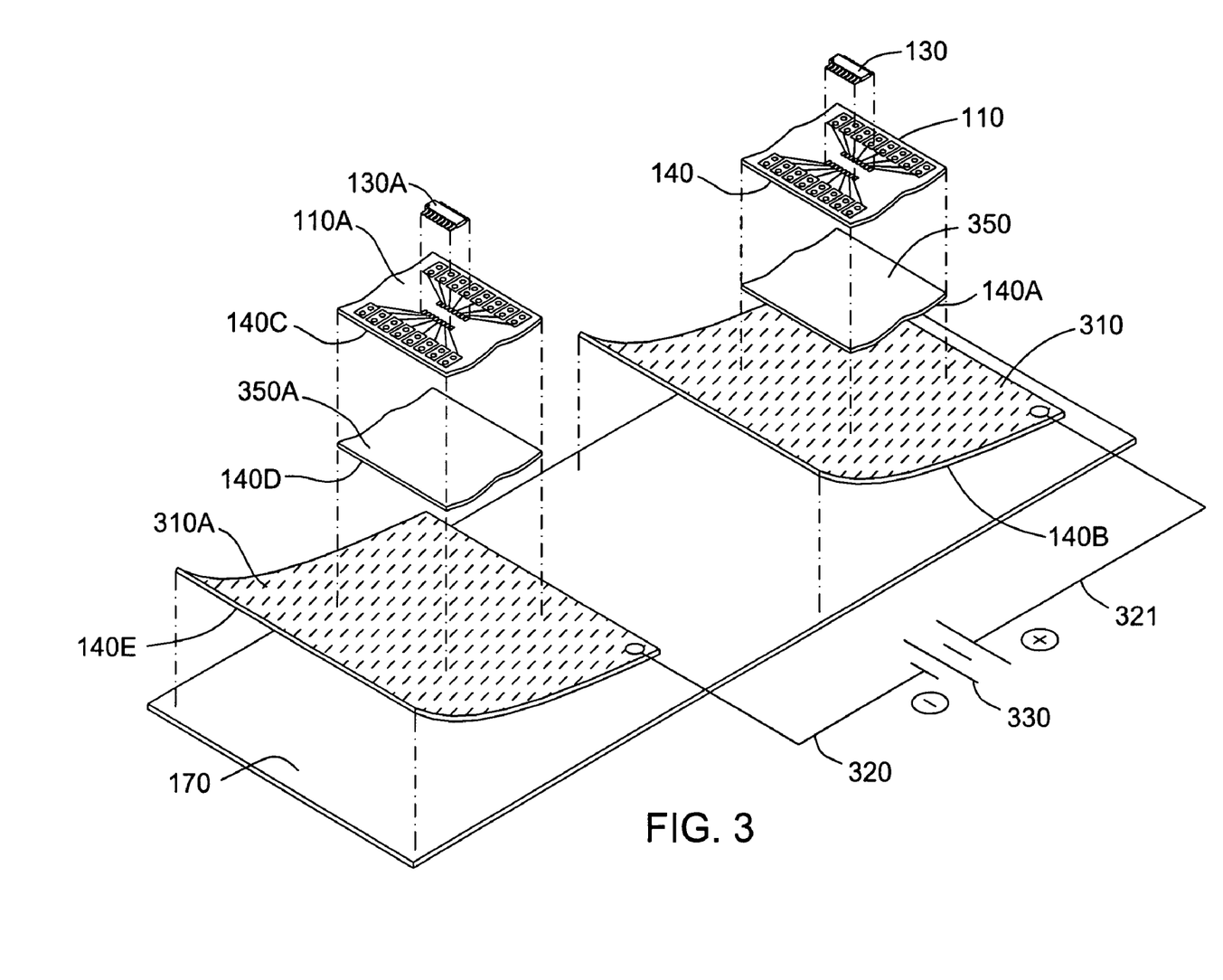
FIG. 3 shows additional embodiments of the electrical component interface that include power, ground and insulating planes (layers).

FIG. 3 shows additional embodiments of the electrical component interface 110, 110a that include power 310, ground 310a and electrically insulating planes (layers) 350, 350a. As shown, an embodiment includes one or more of the power 310, ground 310a and electrically insulating planes (layers) 350, 350a being flexible. Additionally, the power 310, ground 310a and electrically insulating planes (layers) 350, 350a include adhesive layers 140a, 140b, 140c, 140d, 140e, allowing each of different versions of essentially flexible circuit boards (that is, an embodiment includes the power 310, ground 310a and electrically insulating planes (layers) 350 350a being formed from flexible circuit boards) to be easily attached to a surface 170. As shown, the flexible circuit boards can be stacked, allowing for the formation of an electrical circuit with continuous power or ground planes enabling testing of high power or high clock speed electrical components (surface mount and/or through-hole) 130, 130a.

As shown, a power supply 330 can be electrically connected to the power plane 310 and the ground plane 310a through conductors 320, 321. The power plane 310 and the ground plane 3110a can be affixed to, for example, the surface 170.

Figure 4:
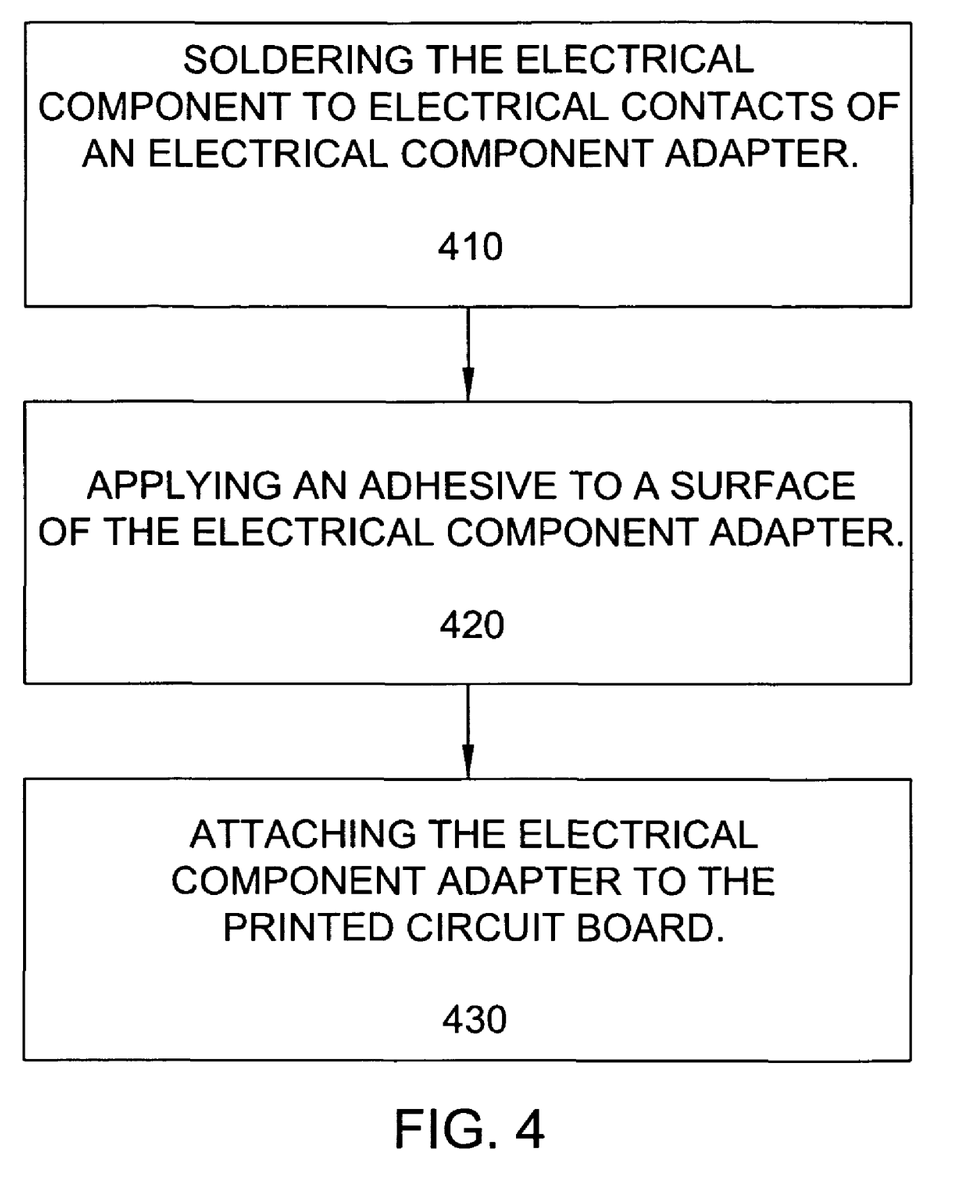
FIG. 4 is a flow chart that shows steps of an example of a method of electrically connecting an electrical component to a printed circuit board.

FIG. 4 is a flow chart that shows steps of an example of a method of electrically connecting an electrical component to a printed circuit board. A first step 410 includes soldering the electrical component to electrical contacts of an electrical component adapter. A second step 420 includes applying an adhesive to a surface of the electrical component adapter. A third step 430 includes attaching the electrical component adapter to the printed circuit board, wherein the adhesive of the electrical component adapter affixes the electrical component adapter to the printed circuit board after attachment. These steps are exemplary, and in no way specify a particular sequence in which the steps are executed. For example, the electrical component can be soldered to the electrical component adapter after the electrical component adapter has been affixed to the printed circuit board.

For one embodiment, the electrical component adapter is a flexible circuit board. For other embodiments, the electrical component adapter is a rigid circuit board, or other type of connectivity device.

As previously described, an embodiment includes a flexible circuit board providing an electrical insulation between the printed circuit board and the electrical component adapter. Another embodiment includes the flexible circuit board comprising a conductive layer that provides the electrical component adapter with at least one of a power plane or ground plane.

Another embodiment additionally includes aligning hole-patterns of the printed circuit board to electrical contacts of the electrical component adapter. For this embodiment, the aligning includes inserting elongated alignment guides through alignment holes of the flexible circuit board, alignment holes of the electrical component adapter and hole pattern of the printed circuit board, and urging the electrical component adapter towards the flexible circuit board, causing attachment of the flexible circuit board to the printed circuit board, and attachment of the electrical component adapter to the flexible circuit board.

For an embodiment, the elongated alignment guides are provided by a proto-board alignment tool that is extracted after attachment, leaving the aligning hole-patterns of the printed circuit board aligned to electrical contacts of the electrical component adapter. This process requires only a few seconds vs. existing component adapter methods that require alignment pins to be soldered to the component adapters or glue, tape, or screws etc. in order to fixture the component adapters to, for example, a hole-matrix proto-board.

Figure 5:
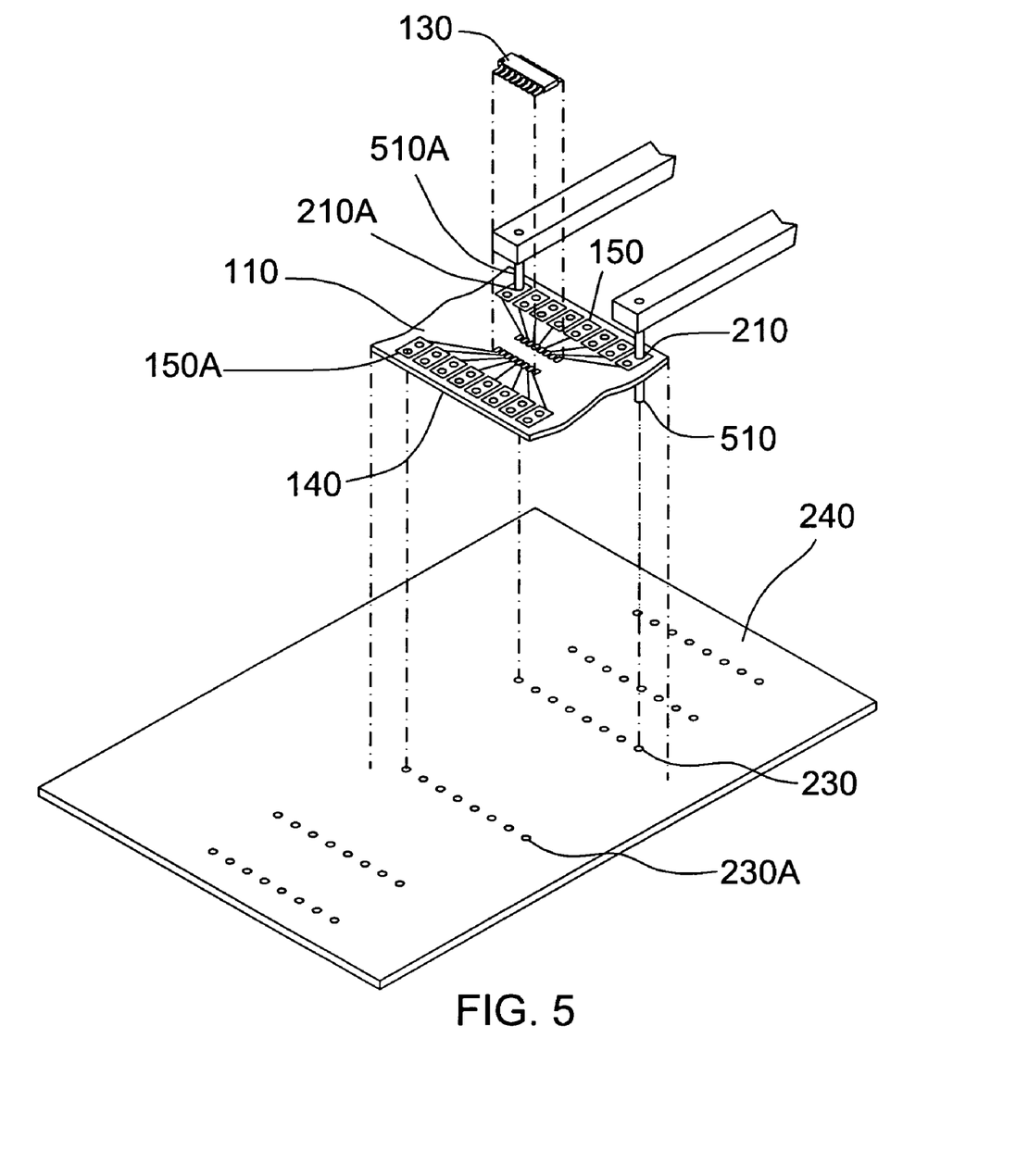
FIG. 5 shows another example of an electrical component interface that is aligned with a circuit board using alignment probes.

FIG. 5 shows another example of an electrical component interface 110 that is aligned with a circuit board using alignment probes 510, 510a (referred to earlier as elongated alignment probes). The alignment probes 510, 510a can be inserted through alignment holes 210, 210a of the electrical component interface 110 and, for example, holes of the hole pattern 230 of the printed circuit board 240. Once inserted, the alignment probes 510, 510a cause the electrical component interface 110 to align with the printed circuit board 240 as the electrical component interface 110 is urged into attachment to the printed circuit board 240. As described, the adhesive backing 140 causes the electrical component interface 110 to attach to the printed circuit board 240. When aligned, electrical contacts 150 (and alignment holes 210) of the electrical component interface 110 can make electrical contact with, for example, electrically conductive portions of the hole pattern 230 of the printed circuit board 240. Attachment of the electrical component 130 to the electrical component interface 110 establishes electrical connections between the electrical component 130 and the printed circuit board 240, through the electrical component interface 110.

Figure 6:
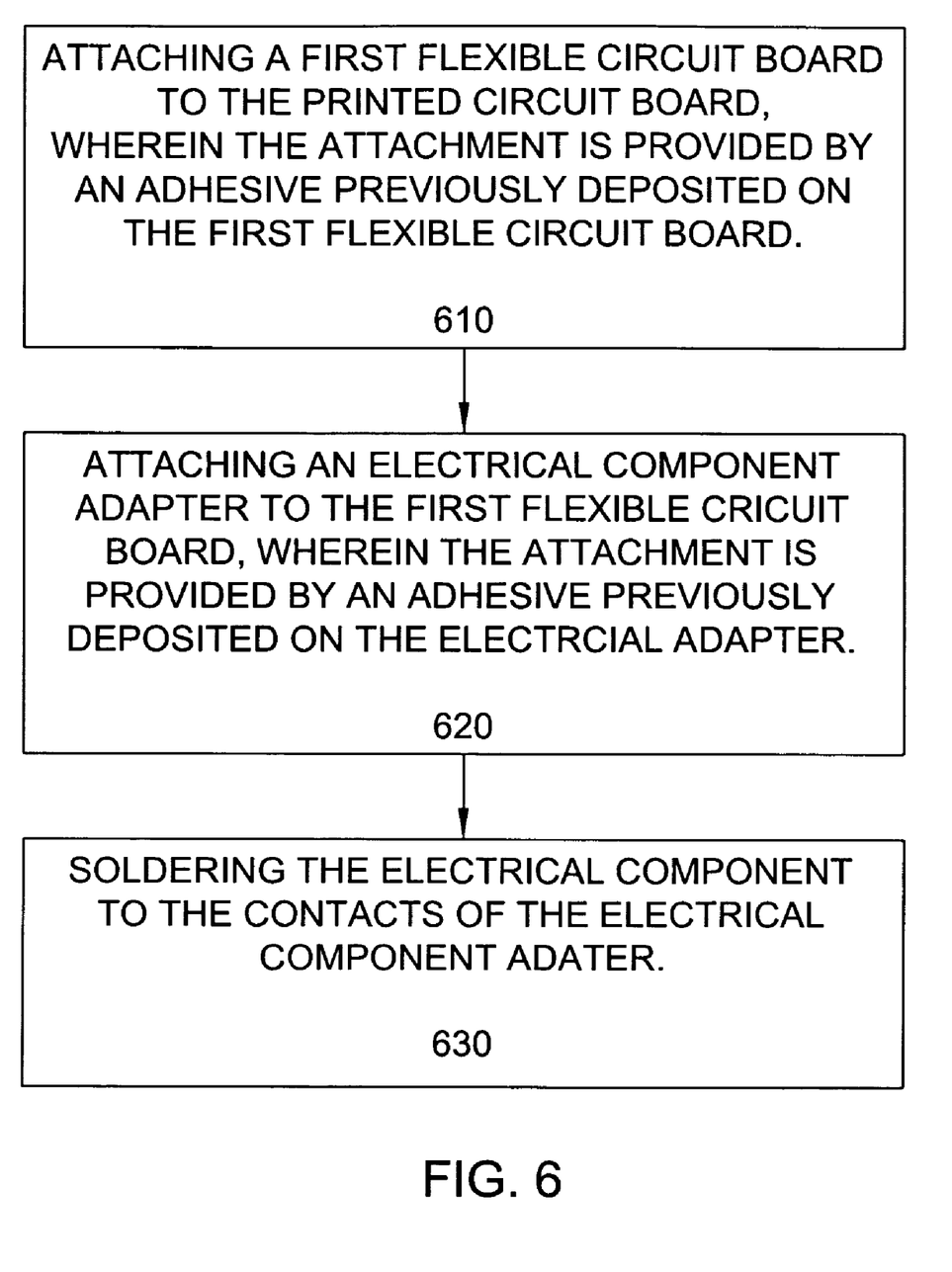
FIG. 6 is a flow chart that shows steps of an example of a method of electrically connecting an electrical component to a printed circuit board.

FIG. 6 is a flow chart that shows steps of an example of a method of electrically connecting an electrical component to a printed circuit board. A first step 610 includes attaching a flexible circuit board to the printed circuit board, wherein the attachment is provided by an adhesive previously deposited on the flexible circuit board. A second step 620 includes attaching an electrical component adapter to the flexible circuit board, wherein the attachment is provided by an adhesive previously deposited on the electrical component adapter. A third step 630 includes soldering the electrical component to electrical contacts of the electrical component adapter. The order of attachment is not critical. That is, for example, the electrical component can be soldered to the electrical component adapter before or after attachment of the electrical component adapter to the flexible circuit board.

Figure 7:
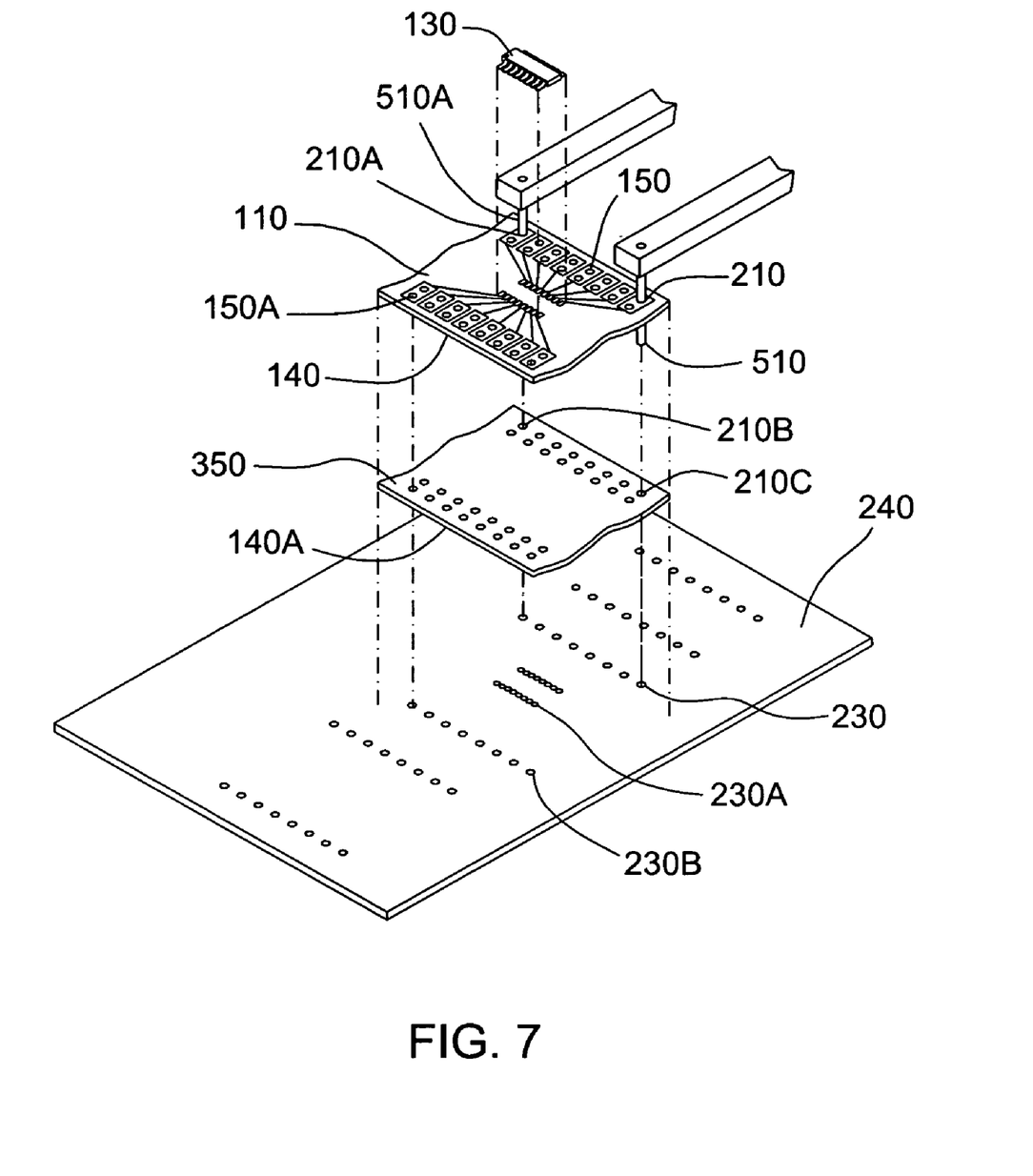
FIG. 7 shows another example of an electrical component interface and an insulating plane (layer) that are both aligned with a circuit board using alignment probes.

FIG. 7 shows another example of an electrical component interface 110 and an insulating plane (layer) 350 that are both aligned with a printed circuit board 240 using alignment probes 510, 510a. An embodiment includes both the electrical component interface 110 and the insulating plane 350 having adhesive backings 140, 140a causing the printed electrical component interface 110 to attach to the insulating layer 350, and causing the insulating layer 350 to attach to the printed circuit board 240. Again, the alignment probes 510, 510a provide alignment of the electrical contacts 150 and alignment holes of the electrical component interface 110 with the alignment holes 210b, 210c of the insulating layer 350, and with the hole pattern 230, 230a, 230b of the printed circuit board 240.

Figure 8:
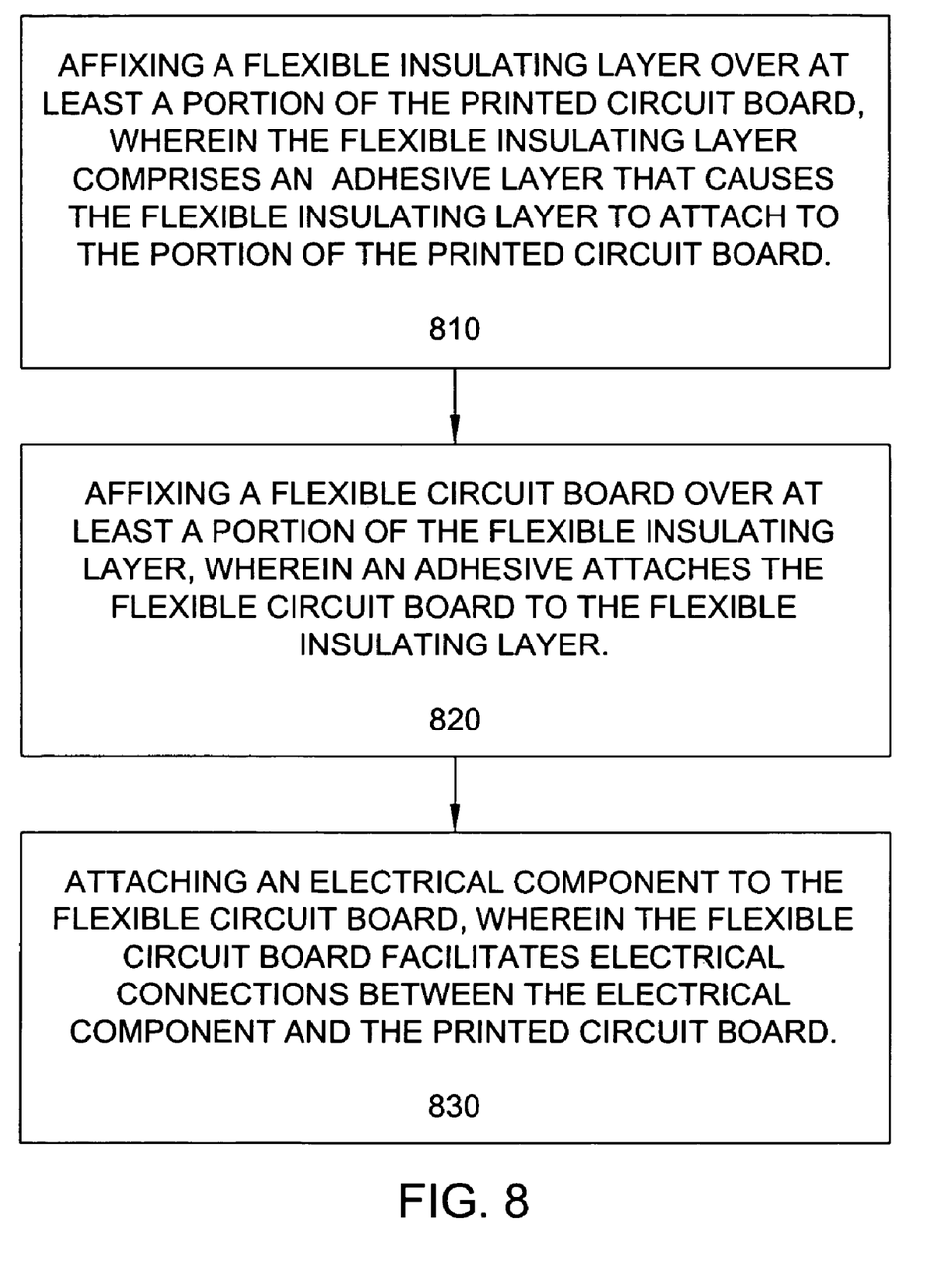
FIG. 8 is a flow chart that shows steps of an example of a method of modifying conductive footprints of a printed circuit board.

FIG. 8 is a flow chart that shows steps of an example of a method of modifying conductive footprints of a printed circuit board. A first step 810 includes affixing a flexible insulating layer over at least a portion of the printed circuit board, wherein the flexible insulating layer includes an adhesive layer that causes the flexible insulating layer to attach to the portion of the printed circuit board. A second step 820 includes affixing a flexible circuit board over at least a portion of the flexible insulating layer, wherein an adhesive attaches the flexible circuit board to the flexible insulating layer. A third step 830 includes attaching an electrical component to the flexible circuit board, wherein the flexible circuit board facilitates electrical connections between the electrical component and the printed circuit board.

Figure 9:
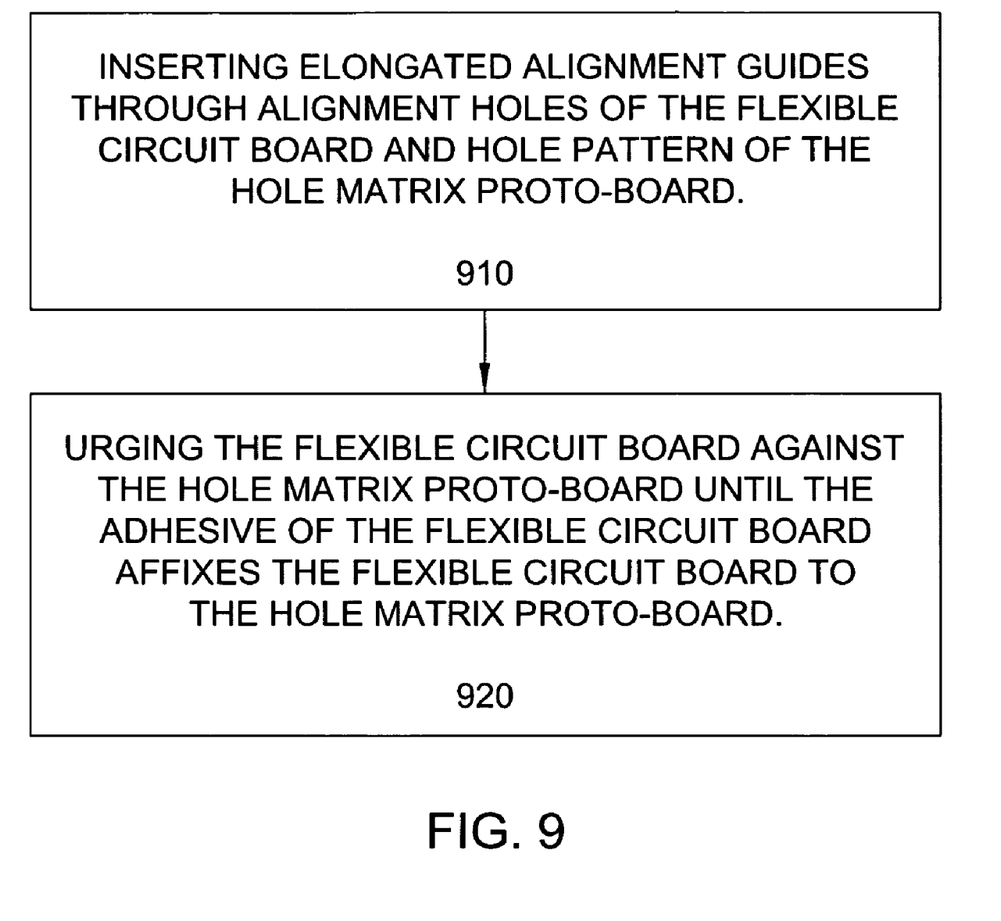
FIG. 9 is a flow chart that shows steps of an example of a method of aligning the electrical contacts of the flexible circuit board to hole-pattern of a hole-matrix proto-board.

FIG. 9 is a flow chart that shows steps of an example of a method of aligning the electrical contacts of the flexible circuit board to hole-pattern of a hole-matrix proto-board. A first step 910 includes inserting elongated alignment guides through alignment holes of the flexible circuit board and hole-pattern of the hole matrix proto-board. A second step 920 includes urging the flexible circuit board against the hole matrix proto-board until the adhesive of the flexible circuit board affixes the flexible circuit board to the hole matrix proto-board.

Figure 10:
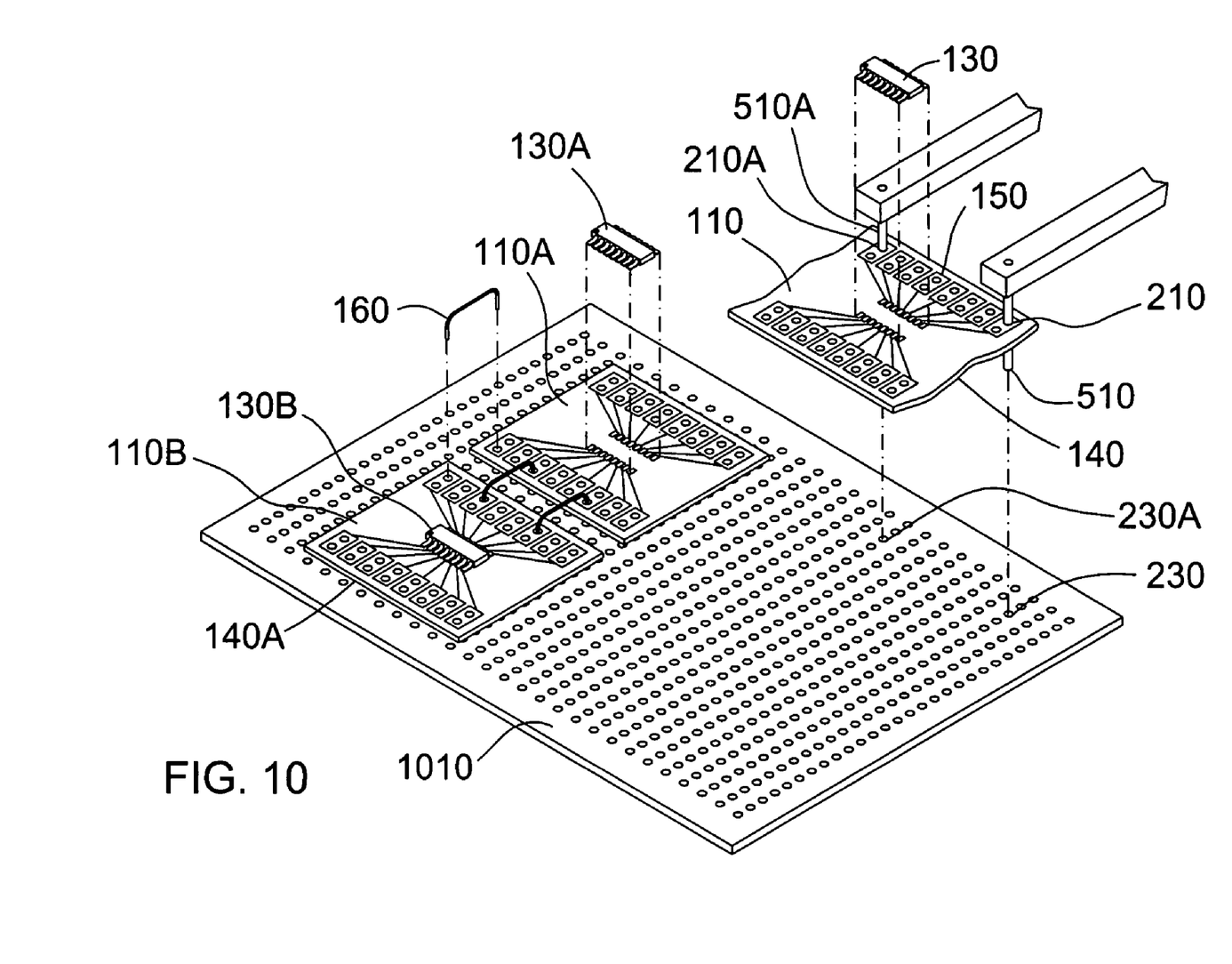
FIG. 10 shows an example of an electrical component interface being attached and aligned to a hole pattern of a hole-matrix proto-board.

FIG. 10 shows an example of electrical component interfaces 110, 110a, 110b attached to a hole-matrix proto-board 1010. As shown, a first electrical component interface 110 is being attached to the hole-matrix proto-board 1010 using the alignment guides 510, 510a to rapidly and easily align the alignment holes 210, 210a of the first electrical component interface 110 with the hole pattern 230, 230a of the hole-matrix proto-board 1010. The adhesive layer 140 provides attachment of the first electrical component interface 110 to the hole-matrix proto-board 1010.

FIG. 10 additionally shows second and third electrical component interfaces 110a, 110b attached to the hole-matrix proto-board 1010. Electrical components 130, 130a, 130b are attached (physically and electrically) to the electrical component interfaces 110, 110a, 110b which are (or to be) electrically connected by wires 160 to each other and/or the hole-matrix proto-board 1010.

Although specific embodiments have been described and illustrated, the described embodiments are not to be limited to the specific forms or arrangements of parts so described and illustrated. The embodiments are limited only by the appended claims.

What is claimed:

1. An electrical component interface comprising:
   an electrical component adapter, the electrical component adapter comprising an electronic component solder pattern for receiving and allowing attachment of an electrical component; and
   an adhesive backing adjacent a surface of the electrical component adapter, the adhesive backing providing attachment of the electrical component adapter to a second surface;
   wherein the electrical component adapter additionally includes alignment holes that allow electrical contacts of the electrical component adapter to be aligned with a hole pattern of a printed circuit board when the electrical component adapter is attached to the printed circuit board.

2. The method of claim 1, wherein the electrical component adapter comprises a flexible circuit board.

3. The interface of claim 1, wherein the electrical component adapter includes surface mount electrical contacts.

4. The interface of claim 1, wherein the electrical component adapter additionally include through-hole electrical contacts.

5. An electrical component interface comprising:
   an electrical component adapter, the electrical component adapter comprising an electronic component solder pattern for receiving and allowing attachment of an electrical component; and
   an adhesive backing adjacent a surface of the electrical component adapter, the adhesive backing providing attachment of the electrical component adapter to a second surface;
   further comprising an electrically conductive surface flexible circuit board, the electrically conductive surface flexible circuit board having an adhesive backing adjacent to at least one surface of the electrically conductive surface flexible circuit board, allowing the electrically conductive surface flexible circuit board to be attached to at least one of the second surface or a third surface, providing a ground plane for the electrical component adapter.

6. An electrical component interface comprising:
   an electrical component adapter, the electrical component adapter comprising an electronic component solder pattern for receiving and allowing attachment of an electrical component; and
   an adhesive backing adjacent a surface of the electrical component adapter, the adhesive backing providing attachment of the electrical component adapter to a second surface;
   further comprising an electrically conductive surface flexible circuit board, the electrically conductive surface flexible circuit board having an adhesive backing adjacent to at least one surface of the electrically conductive surface flexible circuit board, allowing the electrically conductive surface flexible circuit board to attached to at least one of the second surface and a third surface, providing a power plane for the electrical component adapter.

7. An electrical component interface comprising:
   an electrical component adapter, the electrical component adapter comprising an electronic component solder pattern for receiving and allowing attachment of an electrical component; and
   an adhesive backing adjacent a surface of the electrical component adapter, the adhesive backing providing attachment of the electrical component adapter to a second surface;
   further comprising an electrical insulating surface flexible circuit board, the electrical insulating surface flexible circuit board having an adhesive backing adjacent to at least one surface of the electrical insulating surface flexible circuit board, allowing the electrical insulating surface flexible circuit board to attached to a third surface providing an insulating plane between the electrical component adapter and the third surface.

8. An electrical component interface comprising:
   an electrical component adapter, the electrical component adapter comprising an electronic component solder pattern for receiving and allowing attachment of an electrical component; and
   an adhesive backing adjacent a surface of the electrical component adapter, the adhesive backing providing attachment of the electrical component adapter to a second surface;
   wherein the electrical component adapter is receivable by an electrical device test unit chassis, wherein the electrical device test unit chassis comprises:
   an electrically non-conductive surface that receives the electrical component adapter;
   a least one electrical test interface connection electrically connected to the electrical component adapter allowing the electrical component attached to the electrical component adapter to provide control signals through the at least one electrical test interface connection;
   a control panel electrically connected to the electrical test interface allowing an observer to monitor control signals of the electrical component.

9. A method of electrically connecting an electrical component to a printed circuit board, comprising:
   soldering the electrical component to electrical contacts of an electrical component adapter;
   applying an adhesive to a surface of the electrical component adapter; and
   attaching the electrical component adapter to the printed circuit board, wherein the adhesive of the electrical component adapter affixes the electrical component adapter to the printed circuit board after attachment;
   aligning electrical contacts of the electrical component adapter to a hole pattern of the printed circuit board comprising inserting elongated alignment guides through alignment holes of the electrical component adapter and hole pattern of the printed circuit board, and urging the electrical component adapter against the printed circuit board until the adhesive backing of the electrical component adapter affixes the electrical component adapter to the printed circuit board.

10. The method of claim 9, further comprising providing a ground plane or power plane with a flexible electrically conductive surface circuit board.

11. The method of claim 9, wherein the electrical component adapter comprises a flexible circuit board.

12. A method of electrically connecting an electrical component to a printed circuit board, comprising:
- attaching a flexible circuit board to the printed circuit board, wherein the attachment is provided by an adhesive previously deposited on the flexible circuit board;
- attaching a electrical component adapter to the flexible circuit board, wherein the attachment is provided by an adhesive previously deposited on the electrical component adapter; and
- soldering the electrical component to electrical contacts of the electrical component adapter;
- aligning a hole pattern of the printed circuit board to electrical contacts of the electrical component adapter comprising inserting elongated alignment guides through alignment holes of the flexible circuit board, alignment holes of the electrical component adapter and hole pattern of the printed circuit board, and urging the electrical component adapter towards the flexible circuit board, causing attachment of the flexible circuit board to the printed circuit board, and attachment of the electrical component adapter to the flexible circuit board.

13. The method of claim 12, wherein the flexible circuit board provides an electrical insulation between the printed circuit board and the electrical component adapter.

14. The method of claim 12, wherein the flexible circuit board comprises a conductive layer that provides the electrical component adapter with at least one of a power plane or ground plane.

15. The method of claim 12, wherein the electrical component adapter comprises a flexible circuit board.

* * * * *